US008587384B2

(12) United States Patent
Satoh et al.

(10) Patent No.: US 8,587,384 B2
(45) Date of Patent: Nov. 19, 2013

(54) SEMICONDUCTOR INTEGRATED CIRCUIT DEVICE AND OSCILLATION FREQUENCY CALIBRATION METHOD

(75) Inventors: Yuji Satoh, Nagareyama (JP); Mototsugu Hamada, Yokohama (JP); Daisuke Miyashita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 26 days.

(21) Appl. No.: 13/294,086

(22) Filed: Nov. 10, 2011

(65) Prior Publication Data

US 2012/0056682 A1 Mar. 8, 2012

Related U.S. Application Data

(62) Division of application No. 12/726,323, filed on Mar. 17, 2010, now abandoned.

(30) Foreign Application Priority Data

Jan. 27, 2010 (JP) ................................. 2010-015676

(51) Int. Cl.
H03L 1/02 (2006.01)
H03B 5/12 (2006.01)

(52) U.S. Cl.
USPC ...... 331/176; 331/36 C; 331/117 R; 331/167; 331/185

(58) Field of Classification Search
USPC ...... 331/36 C, 117 FE, 117 R, 167, 176, 185, 331/186
See application file for complete search history.

(56) References Cited

U.S. PATENT DOCUMENTS

| 5,331,295 | A | 7/1994 | Jelinek et al. |
| 6,191,660 | B1 | 2/2001 | Mar et al. |
| 6,462,625 | B2 * | 10/2002 | Kim ................................. 331/57 |
| 6,600,380 | B1 * | 7/2003 | Guggenbuhl et al. ..... 331/117 R |
| 6,985,040 | B2 | 1/2006 | Kim |
| 7,044,633 | B2 | 5/2006 | Clabes et al. |
| 7,103,337 | B2 | 9/2006 | Uozumi et al. |
| 7,276,979 | B2 * | 10/2007 | Ishida et al. ..................... 331/17 |
| 7,327,201 | B2 * | 2/2008 | Miyashita et al. ............ 331/185 |
| 7,474,166 | B2 * | 1/2009 | Tanaka ........................ 331/177 V |
| 7,573,342 | B2 * | 8/2009 | Grewing et al. ................ 331/74 |
| 7,592,877 | B2 | 9/2009 | Shiramizu et al. |
| 7,982,551 | B2 * | 7/2011 | Iwaida et al. .................. 331/176 |
| 8,203,392 | B2 * | 6/2012 | Illegems et al. ............... 331/176 |
| 2008/0088379 | A1 | 4/2008 | Chen |
| 2008/0150641 | A1 * | 6/2008 | Costa et al. ..................... 331/16 |
| 2009/0051444 | A1 | 2/2009 | Inoue |

FOREIGN PATENT DOCUMENTS

| JP | 2001-036342 A | 2/2001 |
| JP | 2002-198736 | 7/2002 |
| JP | 2008-311884 A | 12/2008 |

OTHER PUBLICATIONS

Japanese Office Action dated Oct. 2, 2012 for Japanese Application No. 2010-015676 filed on Jan. 27, 2010.

* cited by examiner

Primary Examiner — Levi Gannon
(74) Attorney, Agent, or Firm — Knobbe, Martens, Olson & Bear LLP

(57) ABSTRACT

A semiconductor integrated circuit device includes a DCO and a storing unit that stores a temperature coefficient of an oscillation frequency and an absolute value of the oscillation frequency, which should be set in the DCO, corresponding to potential obtained from a voltage source that changes with a monotonic characteristic with respect to temperature.

7 Claims, 13 Drawing Sheets

FIG.1
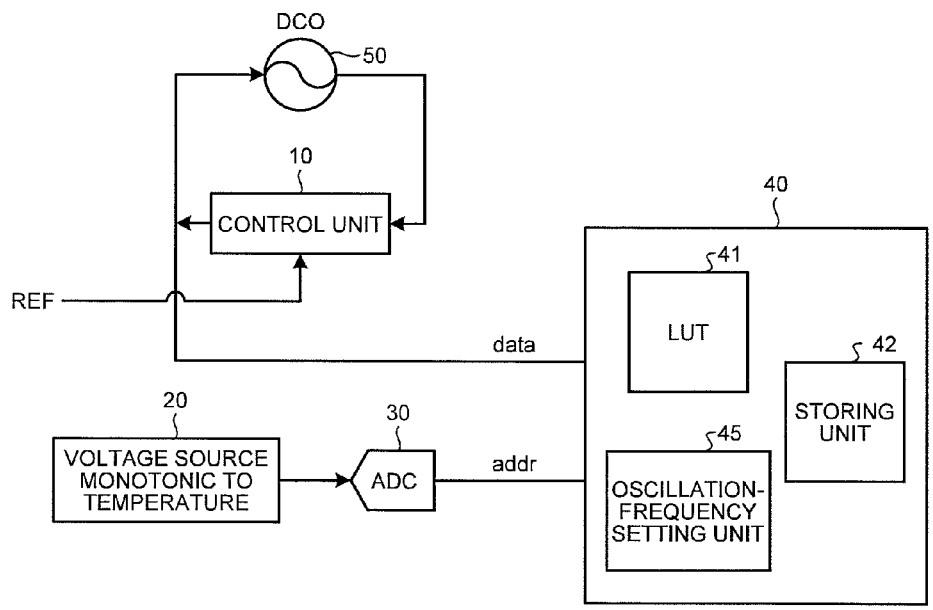
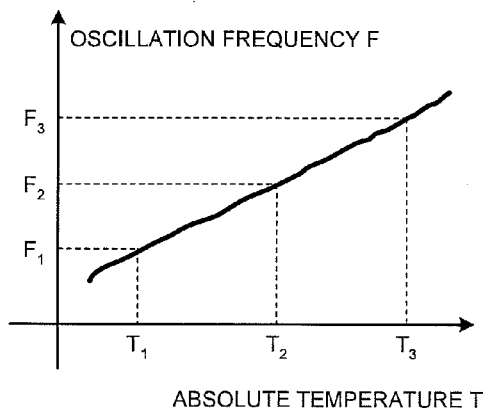
FIG.2A
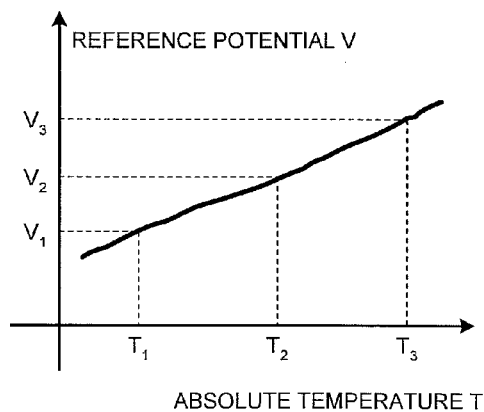
FIG.2B

US 8,587,384 B2

SEMICONDUCTOR INTEGRATED CIRCUIT DEVICE AND OSCILLATION FREQUENCY CALIBRATION METHOD

CROSS-REFERENCE TO RELATED APPLICATIONS

This application is a divisional of U.S. patent application Ser. No. 12/726,323, filed Mar. 17, 2010, which is based upon and claims the benefit of priority of Japanese Patent Application No. 2010-015676, filed on Jan. 27, 2010, the entire contents of each of which are incorporated herein by reference.

BACKGROUND OF THE INVENTION

1. Field of the Invention

The present invention relates to a semiconductor integrated circuit device and an oscillation frequency calibration method.

2. Description of the Related Art

Oscillators are widely used in semiconductor integrated circuits. Before the oscillators are shipped, it is necessary to calibrate an error in an oscillator frequency that occurs in a manufacturing process. Conventionally, a method of calibrating an oscillation frequency is known. In recent years, oscillators having a tight tolerance in oscillation frequency with respect to a temperature change are often required. There is a demand for a solution that satisfies such a need.

As an example of the solution, means for measuring a correspondence relation of an oscillation frequency with respect to an absolute temperature and determining a calibration value is known. However, in this calibration work, extremely long converging time is required when temperature is accurately changed (e.g., changed from T1 to T2). Therefore, the calibration work is a cause of an increase in cost for the calibration. In some case, unless the calibration is applied to the temperature in an entire temperature compensation range, the performance of an oscillator at the time of shipment cannot be guaranteed and a further increase in calibration cost is caused. Therefore, there is a demand for a method that can end the calibration work for an oscillation frequency in a short time.

The related art represented by Japanese Patent Application Laid-Open No. 2008-311884 discloses an oscillation frequency control method that can adjust, when temperature changes, an oscillation frequency to a predetermined reference frequency with high responsiveness and keep the oscillation frequency constant.

However, the related art represented by Japanese Patent Application Laid-Open No. 2008-311884 relates to control of an oscillation frequency with respect to a temperature change after the shipment of an oscillator and cannot satisfy the need for reducing time required for the calibration work for the oscillation frequency.

It is an object of the present invention to provide a semiconductor integrated circuit device and the oscillation frequency calibration method that can reduce the time required for the calibration work for the oscillation frequency of the oscillator.

BRIEF SUMMARY OF THE INVENTION

A semiconductor integrated circuit device according to an embodiment of the present invention comprises an oscillator; and an oscillation-frequency calibrating unit that outputs, based on information for determining an oscillation frequency of the oscillator and potential information obtained from a voltage source that changes with a monotonic characteristic with respect to temperature, a control signal for controlling the oscillator.

A oscillation frequency calibration method according to an embodiment of the present invention comprises generating a control signal based on information for determining an oscillation frequency of the oscillator and potential information obtained from a voltage source that changes with a monotonic characteristic with respect to temperature; and controlling the oscillator with the control signal.

BRIEF DESCRIPTION OF THE DRAWINGS

FIG. 1 is a diagram of a semiconductor integrated circuit device according to a first embodiment of the present invention;

FIG. 2A is a graph of a relation between temperature and an oscillation frequency;

FIG. 2B is a graph of a relation between temperature and voltage reference;

DETAILED DESCRIPTION OF THE INVENTION

Exemplary embodiments of a semiconductor integrated circuit device and an oscillation frequency calibration method according to the present invention will be explained below in detail with reference to the accompanying drawings. The present invention is not limited to the following embodiments.

Figure 3:
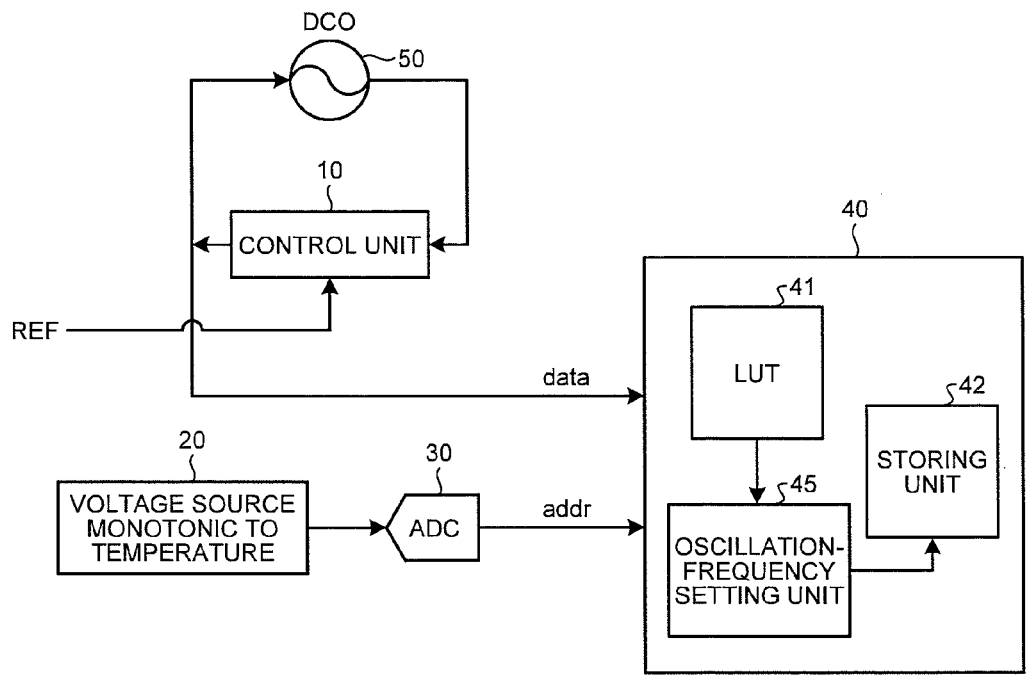
FIG. 3 is a diagram for explaining operation in calibrating a DCO.
Figure 4:
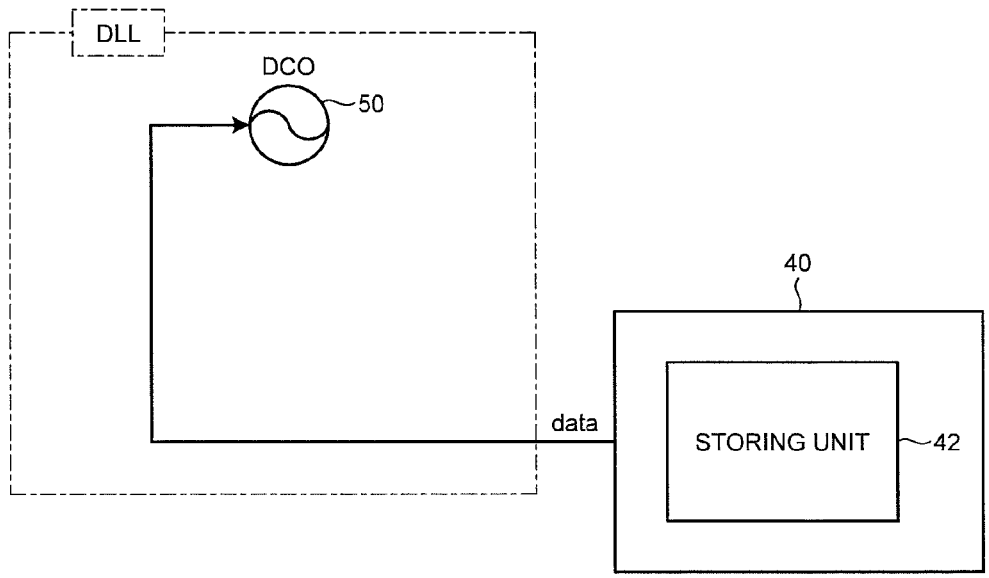
FIG. 4 is a diagram for explaining operation after the shipment of the DCO.

FIG. 1 is a diagram of a semiconductor integrated circuit device according to a first embodiment of the present invention. FIG. 2A is a graph of a relation between temperature and an oscillation frequency. FIG. 2B is a graph of a relation between temperature and voltage reference. FIG. 3 is a diagram for explaining operation in calibrating a DCO. FIG. 4 is a diagram for explaining operation after the shipment of the DCO.

The semiconductor integrated circuit device shown in FIG. 1 includes an oscillation-frequency calibrating unit 40, a voltage source 20 having a monotonic characteristic with respect to temperature, an analog to digital converter (ADC) 30, a digital controlled oscillator (DCO) 50 as a calibration target, and a control unit 10 that controls the DCO 50.

An output end of the DCO 50 is connected to an input end of the control unit 10. A not-shown reference oscillator (which oscillates at a fixed oscillation frequency irrespectively of temperature) is connected to the control unit 10. The control unit 10 controls a reference oscillation frequency REF from the reference oscillator and an output (an oscillation frequency) of the DCO 50 to coincide with each other and outputs a result of the control to the DCO 50 as digital information. A stabilized state is generally represented as a locked state. The DCO 50, the control unit 10, and the reference oscillation frequency REF form, as a whole, for example, a delay locked loop (DLL) a phase locked loop (PLL), or a frequency locked loop (FLL). The output of the control unit 10 is input to the oscillation-frequency calibrating unit 40 as information (data) for determining an oscillation frequency of the DCO 50.

The voltage source 20 is a voltage source having a monotonic characteristic with respect to temperature. In the voltage source 20, for example, an electric current (proportional to absolute temperature: Ipat)), which linearly changes with respect to temperature, is set as a resistance load by a not-shown voltage reference (band-gap reference: BGR). The ADC 30 converts potential from the voltage source 20 into a digital signal. Potential information (addr) converted into the digital signal is input to the oscillation-frequency calibrating unit 40.

The oscillation-frequency calibrating unit 40 includes a look-up table (LUT) 41, an oscillation-frequency setting unit 45, and a storing unit 42. Information for determining an oscillation frequency corresponding to the DCO 50 and potential information are stored in the LUT 41 in advance. The oscillation-frequency setting unit 45 sets, based on information (data) and potential information (addr) corresponding to first and second temperatures, a temperature coefficient of the oscillation frequency and an absolute value of the oscillation frequency referring to the information (data) and the potential information (addr) stored in the LUT 41 in advance. The storing unit 42 stores the set temperature coefficient and absolute value of the oscillation frequency.

A relation among an absolute temperature T (hereafter simply referred to as "temperature T"), voltage reference V, and an oscillation frequency F related to calibration of an oscillation frequency is explained with reference to FIGS. 2A and 2B. The oscillation frequency F with respect to the temperature T is shown in FIG. 2A. The oscillation frequency F corresponds to information for determining an oscillation frequency. The voltage reference V with respect to the temperature T is shown in FIG. 2B. The voltage reference V corresponds to potential information from the power supply source 20. The semiconductor integrated circuit device according to this embodiment calibrates the DCO 50 using the voltage reference V having a monotonic characteristic with respect to temperature and the oscillation frequency F.

For example, voltage reference and an oscillation frequency corresponding to temperature T1 are voltage reference V1 and an oscillation frequency F1. voltage reference and an oscillation frequency corresponding to the temperature T2 are voltage reference V2 and an oscillation frequency F2. In other words, the voltage reference V and the oscillation frequency F are in a one-to-one correspondence relation with respect to certain temperature. The semiconductor integrated circuit device according to this embodiment measures an oscillation frequency of the DCO 50 with respect to arbitrary temperature and the potential of the voltage source 20 with respect to the arbitrary temperature and executes, referring to the LUT 41 in which the oscillation frequency and the potential of the DCO 50 are stored in advance, calibration for setting the oscillation frequency to a desired oscillation frequency.

A procedure for calibrating the DCO 50 using the information for determining an oscillation frequency and the potential information stored in the LUT 41 is specifically explained below.

The semiconductor integrated circuit device measures information (data) and potential information (addr) for determining an oscillation frequency at appropriate temperature (hereinafter, "first temperature"). It is assumed that the voltage source 20 and the DCO 50 are set in environments having substantially the same temperature changes. Basically, the first temperature can be any temperature as long as the temperature is within an operation range of the DCO 50. In a state of the first temperature, the semiconductor integrated circuit device locks the DCO 50 and inputs information (data) and potential information (addr) at the first temperature.

Subsequently, the semiconductor integrated circuit device changes the ambient temperature of the voltage source 20 and the DCO 50 and performs measurement at the temperature after the change (hereinafter, "second temperature"). The second temperature can be temperature lower or higher than the first temperature. What is important is only to change the temperature. Therefore, for example, the air can be continuously heated by a heater or the like or a heat source such as a resistor can be set. In a state of the second temperature, the semiconductor integrated circuit device locks the DCO 50 and inputs information (data) and potential information (addr) at the second temperature to the oscillation-frequency calibrating unit 40.

As a result, the oscillation-frequency setting unit 45 obtains the information (data) and the potential information (addr) corresponding to the first and second temperatures. The oscillation-frequency setting unit 45 sets, based on the information (data) and the potential information (addr) corresponding to the first and second temperatures, a temperature coefficient of the oscillation frequency and an absolute value of the oscillation frequency referring to the information (data) and the potential information (addr) stored in the LUT 41 in advance. The set temperature coefficient and absolute value of the oscillation frequency are stored in the storing unit 42. After the shipment of the DCO 50, as shown in FIG. 4, a control signal (data) derived from the temperature coefficient and the absolute value of the oscillation frequency stored in the storing unit 42 is output to the DCO 50. The oscillation frequency of the DCO 50 is controlled by the control signal.

As explained above, the semiconductor integrated circuit device according to this embodiment calibrates the oscillation frequency of the DCO 50 based on the temperature coefficient and the absolute value of the oscillation frequency that changes according to potential obtained from the voltage source 20 that changes with the monotonic characteristic with respect to temperature. Therefore, temperature operation involved in the calibration of the DCO 50 is unnecessary. With the semiconductor integrated circuit device according to this embodiment, time required for the calibration work is substantially reduced. As a result, it is possible to substantially reduce cost for the calibration of the DCO 50.

Figure 5:
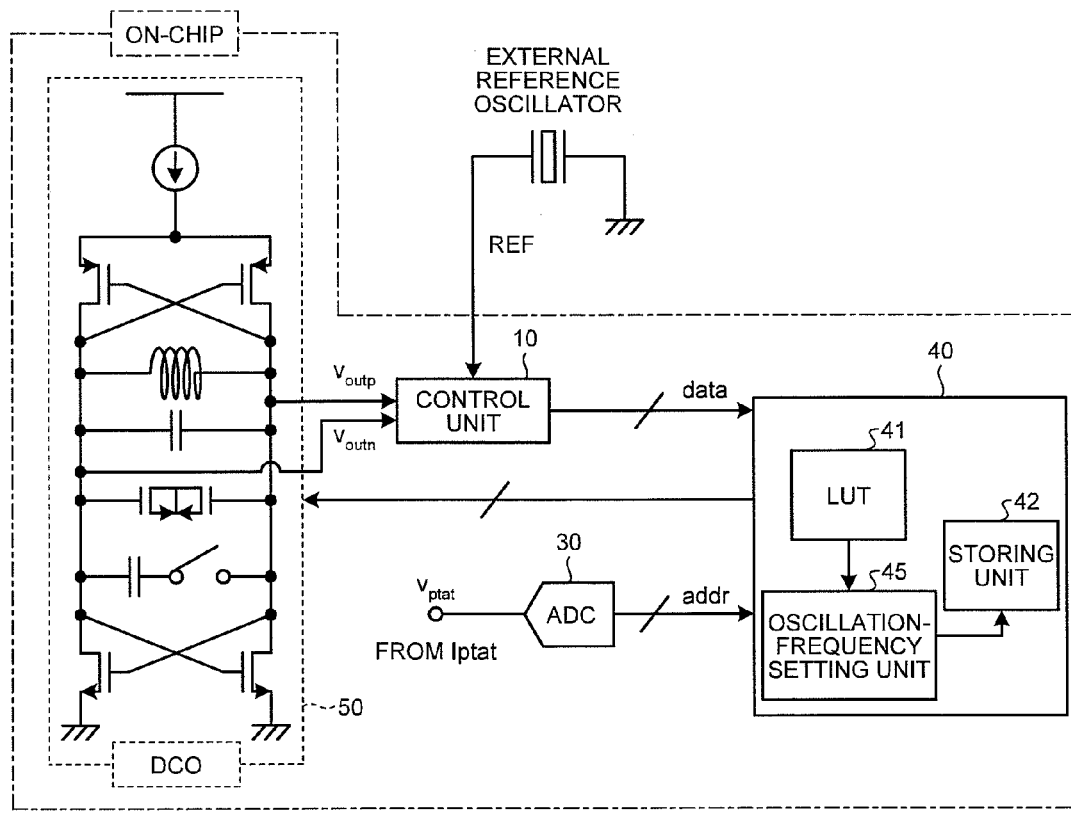
FIG. 5 is a diagram of a semiconductor integrated circuit device according to a second embodiment of the present invention.
Figure 6:
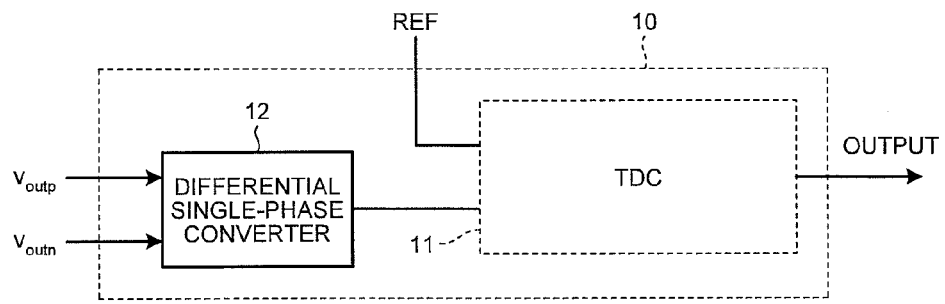
FIG. 6 is a diagram of the internal configuration of a control unit shown in FIG. 5.
Figure 7:
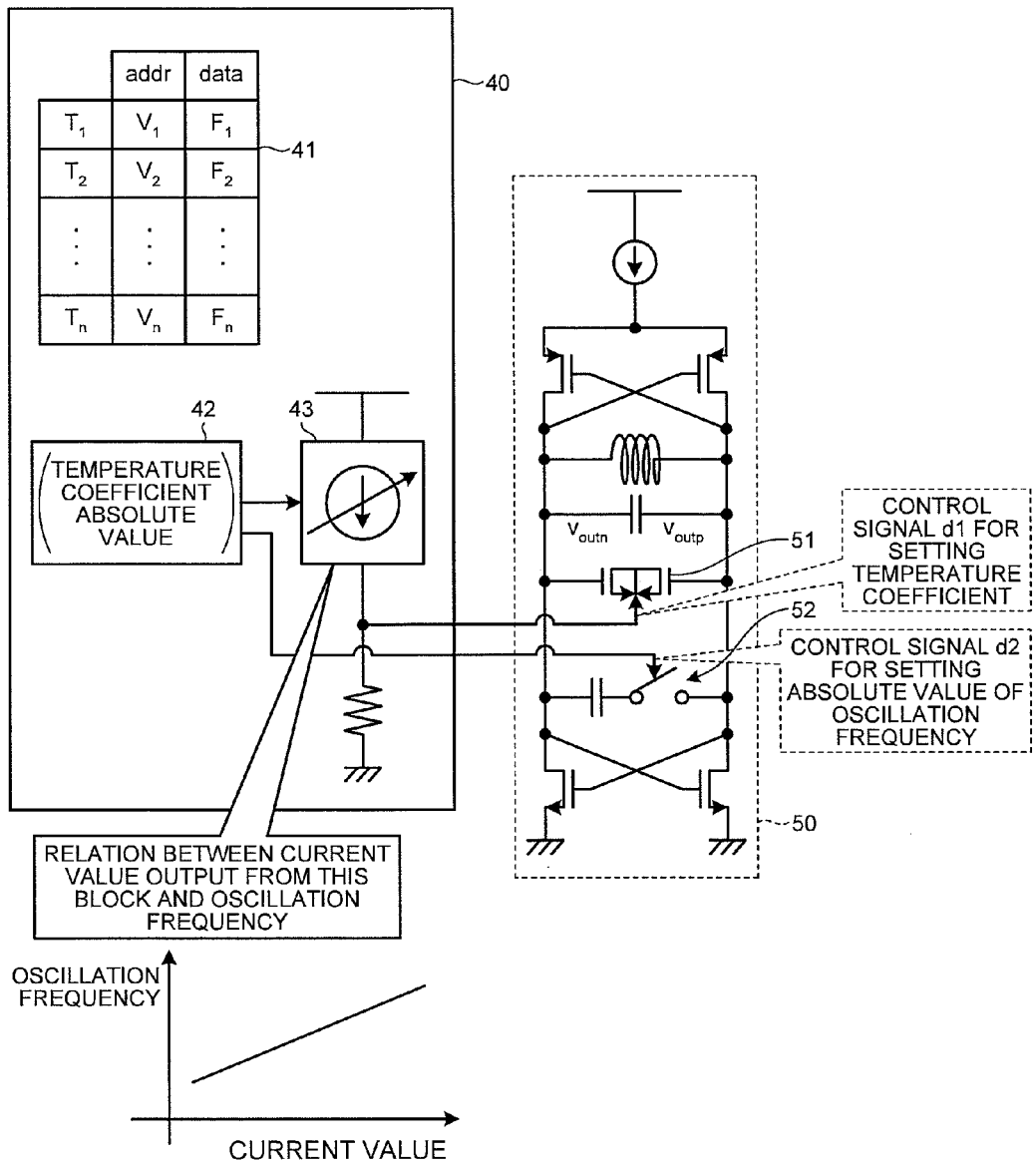
FIG. 7 is a diagram for explaining control signals after the shipment of a DCO shown in FIG. 5.
Figure 8:
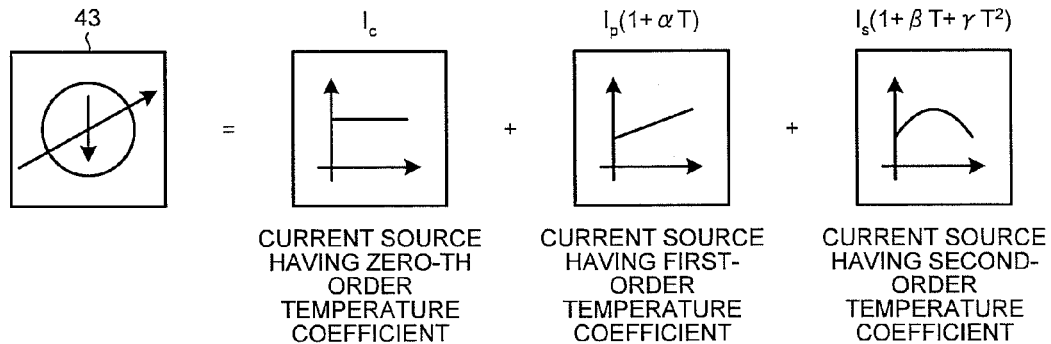
FIG. 8 is a diagram of a relation between a current source shown in FIG. 7 and a temperature characteristic.
Figure 9A:
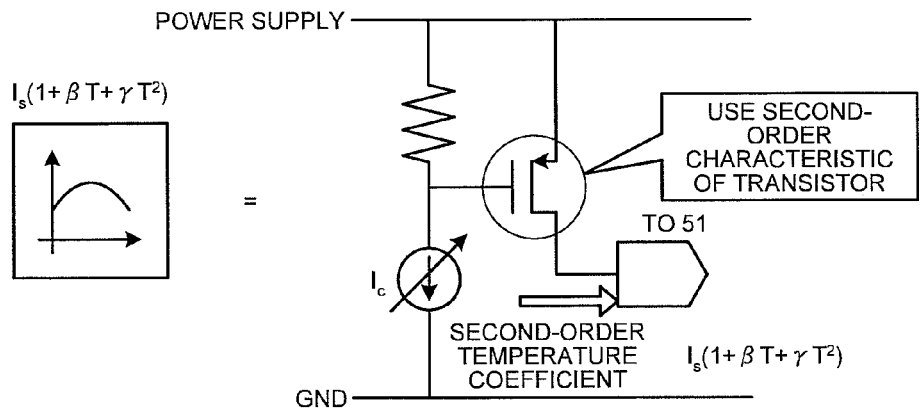
FIG. 9A is a diagram of an equivalent circuit of a current source Is shown in FIG. 8.
Figure 9B:
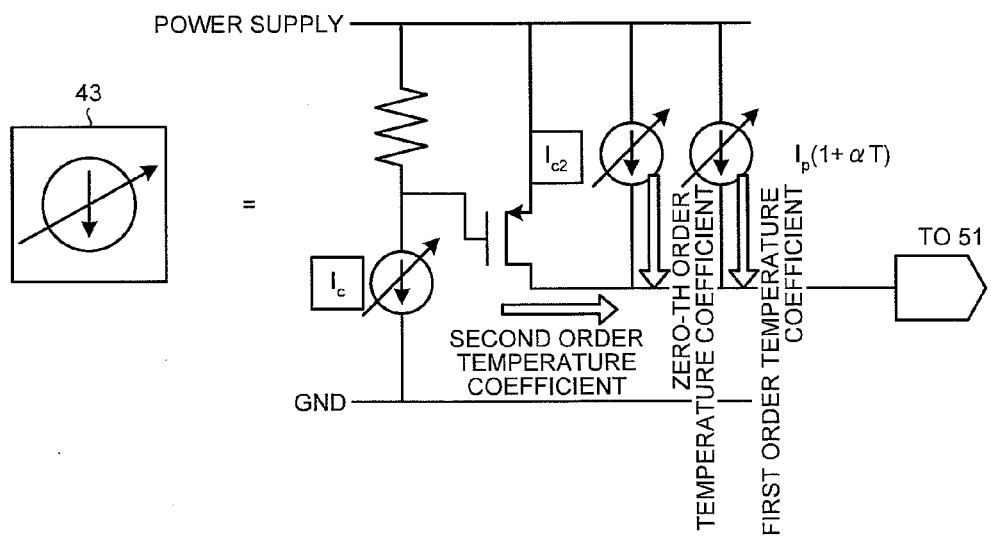
FIG. 9B is a diagram of an equivalent circuit of a current source 43 shown in FIG. 8.

FIG. 5 is a diagram of a semiconductor integrated circuit device according to a second embodiment of the present invention. FIG. 6 is an internal diagram of a control unit shown in FIG. 5. FIG. 7 is a diagram for explaining control signals after the shipment of a DCO shown in FIG. 5. FIG. 8 is a diagram of a relation between a current source shown in FIG. 7 and a temperature characteristic. FIG. 9A is a diagram of an equivalent circuit of a current source Is shown in FIG. 8. FIG. 9B is a diagram of an equivalent circuit of a current source 43 shown in FIG. 8. In the following explanation, components same as those in the first embodiment are denoted by the same reference numerals and signs and explanation of the components is omitted. Only differences from the first embodiment are explained below.

In the semiconductor integrated circuit device shown in FIG. 5, the DCO 50 according to the first embodiment is realized by an LC oscillator (a balanced oscillator). Outputs Voutp and Voutn of the DCO 50 are output to the control unit 10. The control unit 10 shown in FIG. 6 includes a differential single-phase converter 12 and a time-to-digital converter (TDC) 11. The differential single-phase converter 12 converts the outputs Voutp and Voutn from the DCO 50 into a single-phase signal. The TDC 11 compares the single-phase signal from the differential single-phase converter 12 and a reference oscillation frequency REF from the outside and outputs a difference between the single-phase signal and the reference oscillation frequency REF as digital information. The information output from the TDC 11 is input to the oscillation-frequency calibrating unit 40 as information (data). In FIG. 5, a voltage source is shown as proportional to absolute temperature (Vpat). A section shown as On-Chip in FIG. 5 is a section that is mounted on an oscillator to be shipped.

A calibration procedure for the DCO 50 is explained below. The semiconductor integrated circuit device locks the DCO 50 at the first temperature. The output of the control unit 10 is input to the oscillation-frequency calibrating unit 40 as information (data) for determining an oscillation frequency of the DCO 50. The ADC 30 converts Vptat into a digital signal (potential information addr) and inputs the digital signal to the oscillation-frequency calibrating unit 40. Subsequently, the semiconductor integrated circuit device locks the DCO 50 in the state of the second temperature. The semiconductor integrated circuit device acquires information (data) and potential information (addr) at the second temperature. As a result, the oscillation-frequency calibrating unit 40 obtains the information (data) and the potential information (addr) corresponding to the first and second temperatures.

The oscillation-frequency setting unit 45 sets, based on the information (data) and the potential information (addr) and the information (data) and the potential information (addr) corresponding to the first and second temperatures, a temperature coefficient and an absolute value of the oscillation frequency referring to the LUT 41. The set temperature coefficient and absolute value of the oscillation frequency are stored in the storing unit 42. After the shipment of the DCO 50, a control signal derived from the temperature coefficient and the absolute value of the oscillation frequency stored in the storing unit 42 is output to the DCO 50. The oscillation frequency of the DCO 50 is controlled by the control signal.

The configuration of the oscillation-frequency calibrating unit 40 is specifically explained below.

The temperature coefficient and the absolute value of the oscillation frequency set by the oscillation-frequency setting unit 45 are recorded in the storing unit 42 shown in FIG. 7. The temperature coefficient of the oscillation frequency is input to the current source 43. The current source 43 generates a control signal d1 indicating a control amount of the DCO 50 corresponding to the temperature coefficient stored in the storing unit 42 and outputs the control signal d1 to a variable capacitor 51 of the DCO 50. A switch 52 of the DCO 50 is controlled by using the absolute value of the oscillation frequency as a control signal d2 indicating a control amount of the DCO 50 corresponding to the absolute value.

A concept in performing second-order temperature correction in the current source 43 shown in FIG. 7 is shown in FIG. 8. For example, a current source having a second-order temperature characteristic can be realized by adding up a current source Ic having a zero-th order temperature coefficient, a current source Ip having a first-order temperature coefficient, and a current source Is having a second-order temperature coefficient. The current source Is shown in FIG. 9A can be realized by using the second-order characteristic of a transistor. The current source 43 shown in FIG. 9B can be realized by using the current sources Ic, Ip, and Is as shown in FIG. 8. As a result, in addition to an effect same as that in the first embodiment, it is possible to calibrate an oscillation frequency taking into account a nonlinear characteristic of a transistor included in the LC oscillator. Coefficients Ic, Ip, Is, $\alpha$, $\beta$, and $\gamma$ can be positive or negative.

Figure 10:
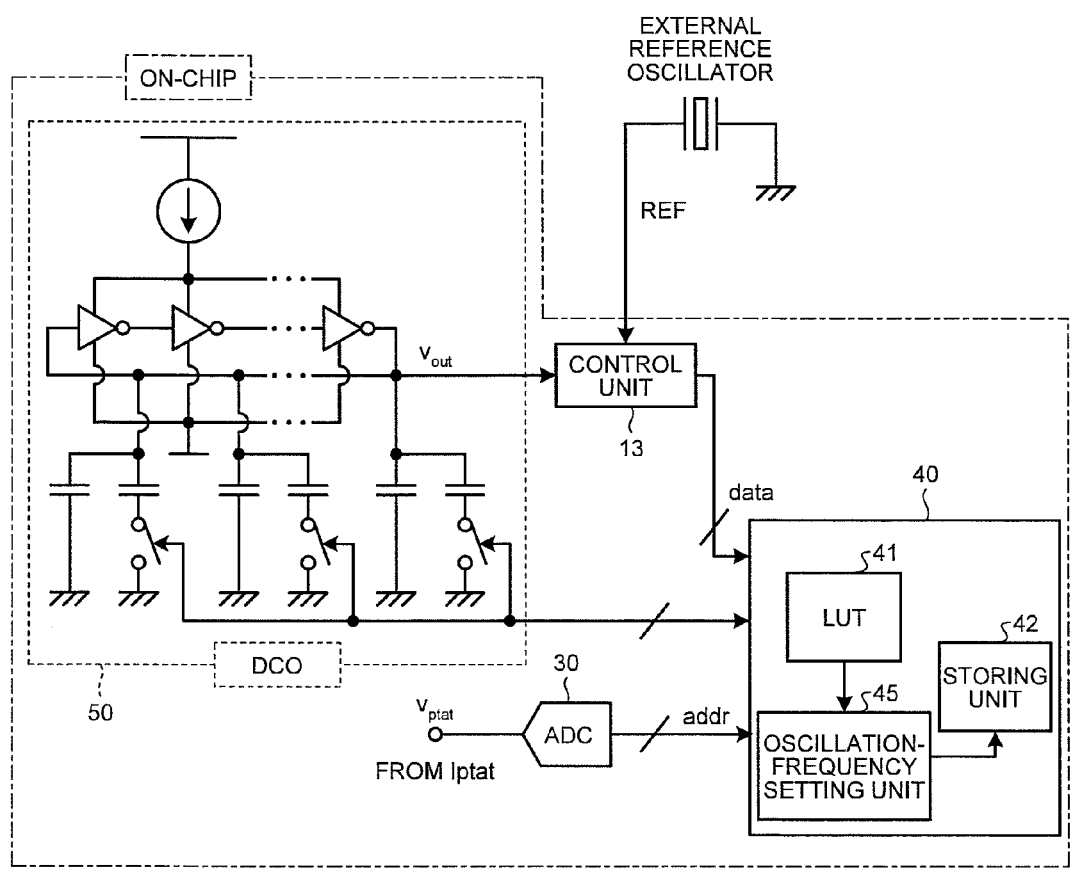
FIG. 10 is a diagram of a semiconductor integrated circuit device according to a third embodiment of the present invention.
Figure 11:
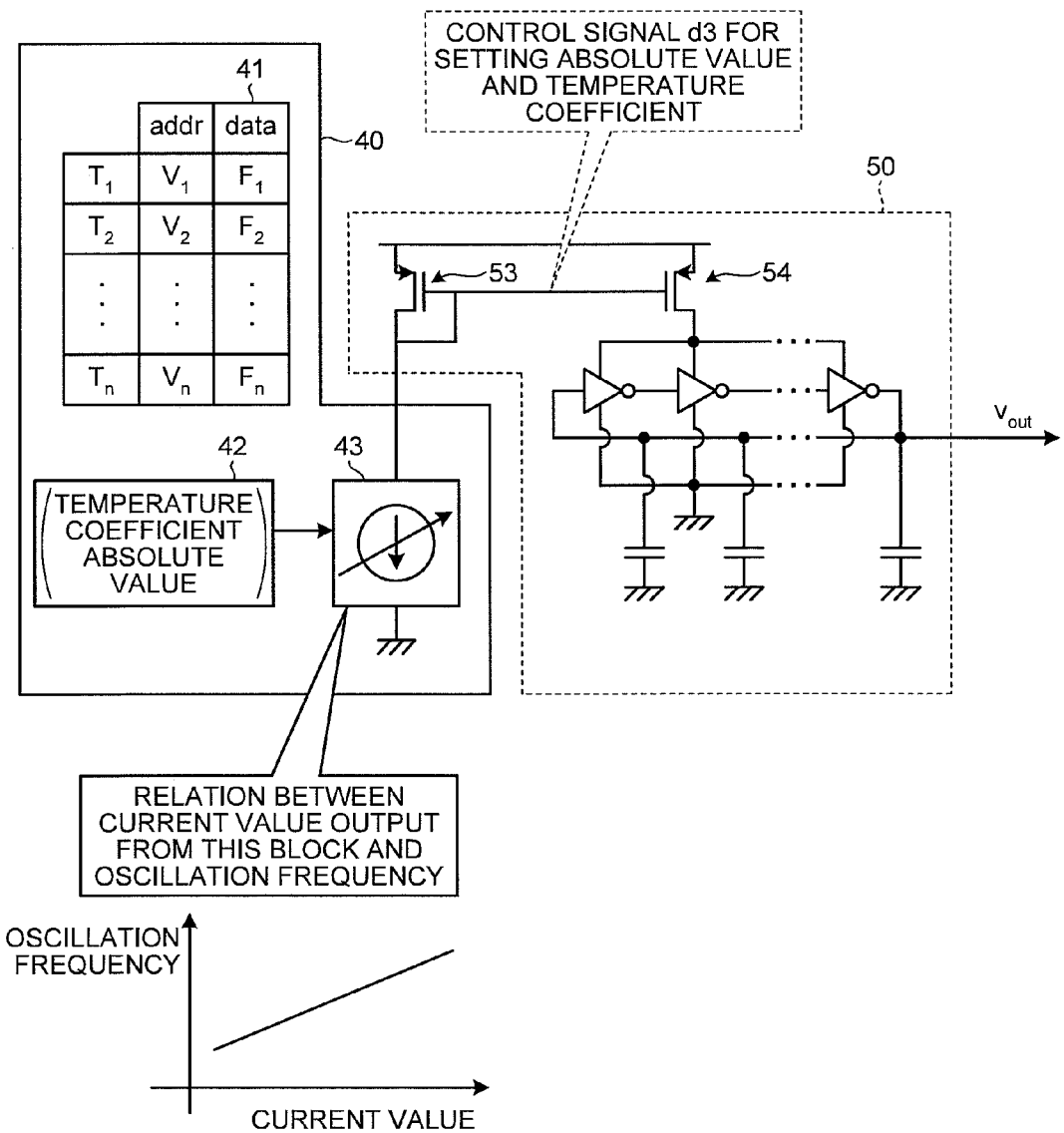
FIG. 11 is a diagram for explaining a control signal after the shipment of a DCO shown in FIG. 10.
Figure 12:
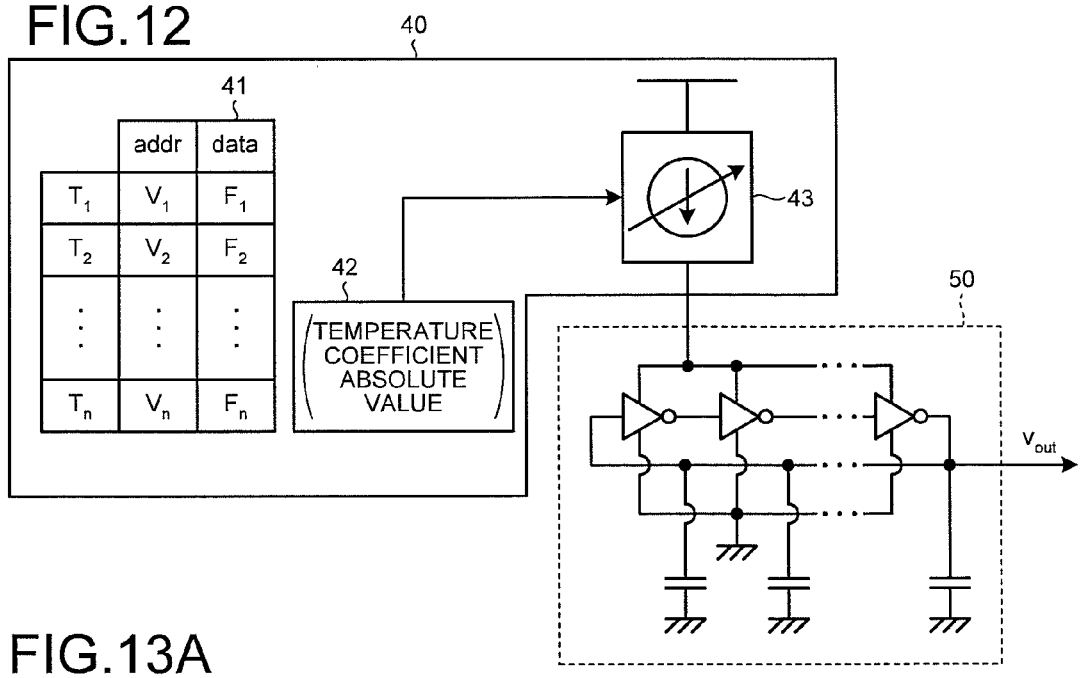
FIG. 12 is a diagram of a configuration example in which a current source is connected to a ring oscillator.
Figure 13A:
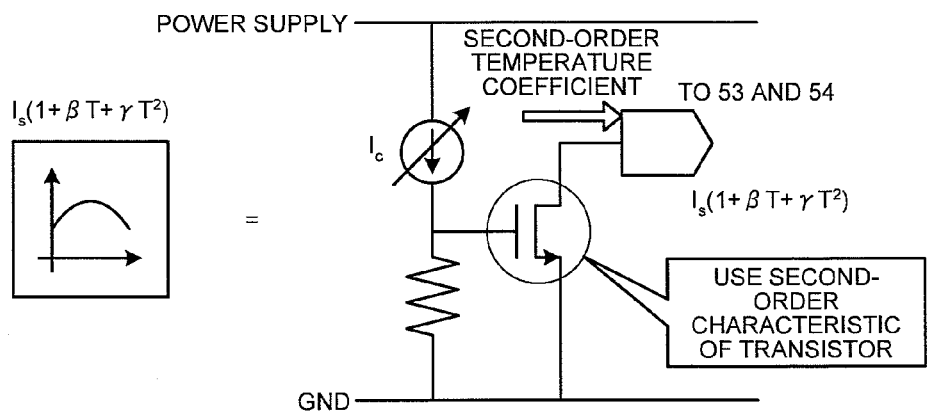
FIG. 13A is a diagram of an equivalent circuit of a current source is shown in FIG. 8.
Figure 13B:
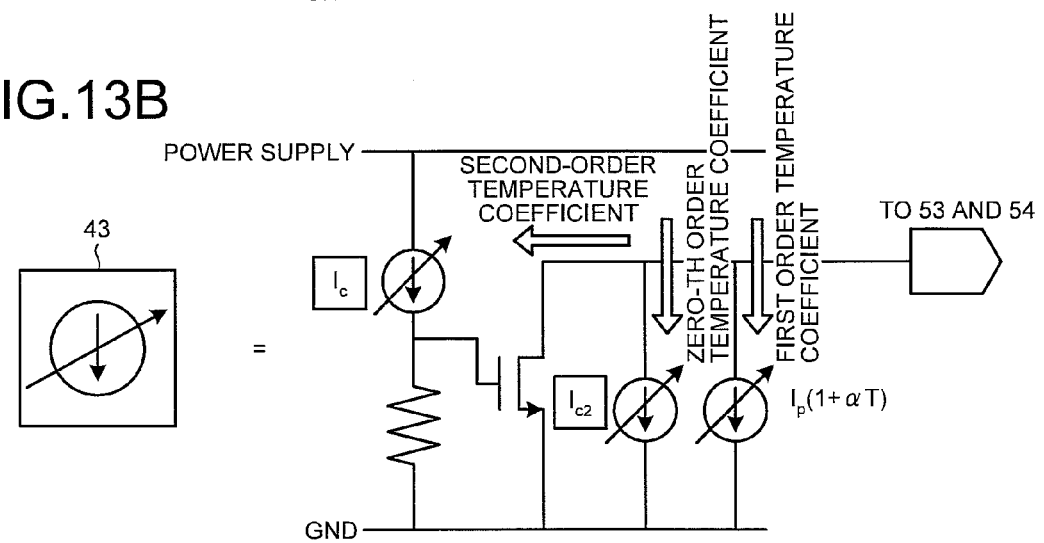
FIG. 13B is a diagram of an equivalent circuit of the current source 43 shown in FIG. 8.

FIG. 10 is a diagram of the configuration of a semiconductor integrated circuit device according to a third embodiment of the present invention. FIG. 11 is a diagram for explaining a control signal after the shipment of a DCO shown in FIG. 10. FIG. 12 is a diagram of a configuration example in which a current source is connected to a ring oscillator. FIG. 13A is a diagram of an equivalent circuit of the current source Is shown in FIG. 8. FIG. 13B is a diagram of an equivalent circuit of the current source 43 shown in FIG. 8. In the following explanation, components same as those in the first embodiment are denoted by the same reference numerals and signs and explanation of the components is omitted. Only differences from the first embodiment are explained below.

In the semiconductor integrated circuit device shown in FIG. 10, the DCO 50 according to the first embodiment is realized by a ring oscillator. An output Vout of the DCO 50 is output to a control unit 13.

The control unit 13 shown in FIG. 10 has a function equivalent to that of the TDC shown in FIG. 6. The control unit 13 compares the output Vout from the DCO 50 and the reference oscillation frequency REF and outputs a difference between the output Vout and the reference oscillation frequency REF as digital information. The information output from the control unit 13 is input to the oscillation-frequency calibrating unit 40 as information (data). A section shown as On-Chip in FIG. 10 is a section that is mounted on an oscillator to be shipped. As the ring oscillator, an example of a single-phase ring oscillator is shown. However, the ring oscillator can be a differential ring oscillator. In the case of the differential ring oscillator, the control unit 13 has a configuration equivalent to that of the control unit 10 shown in FIG. 10.

A calibration procedure for the DCO 50 is explained below. The semiconductor integrated circuit device locks the DCO 50 at the first temperature. The output of the control unit 13 is input to the oscillation-frequency calibrating unit 40 as information (data) for determining an oscillation frequency of the DCO 50. The ADC 30 converts Vptat into a digital signal. The potential information (addr) from the ADC 30 converted into the digital signal is input to the oscillation-frequency calibrating unit 40. Subsequently, the semiconductor integrated circuit device locks the DCO 50 in the state of the second temperature and acquires information (data) and potential information (addr) at the second temperature. As a result, the oscillation-frequency calibrating unit 40 obtains the information (data) and the potential information (addr) corresponding to the first and second temperatures.

The oscillation-frequency setting unit 45 sets, based on the information (data) and the potential information (addr) stored in the LUT 41 in advance and the information (data) and the potential information (addr) corresponding to the first and second temperatures, a temperature coefficient and an absolute value of the oscillation frequency. The set temperature coefficient and absolute value of the oscillation frequency are stored in the storing unit 42. After the shipment of the DCO 5, a control signal (data) derived from the temperature coefficient and the absolute value stored in the storing unit 42 is output to the DCO 50.

The configuration of the oscillation-frequency calibrating unit 40 is specifically explained below.

In FIG. 11, the temperature coefficient and the absolute value of the oscillation frequency set by the oscillation-frequency setting unit 45 are recorded in the storing unit 42. The temperature coefficient and the absolute value of the oscillation frequency are input to the current source 43. The current source 43 generates a control signal d3 indicating a control amount of the DCO 50 corresponding to the temperature coefficient and the absolute value from the storing unit 42 and outputs the control signal d3 to transistors 53 and 54 of the DCO 50. As shown in FIG. 12, the current source 43 can be directly connected to the ring oscillator without the intervention of the transistors 53 and 54.

The current source Is shown in FIG. 13A can be realized by using the second-order characteristic of a transistor. As shown in FIG. 8, the current source 43 shown in FIG. 13B can be realized by using the current sources Ic, Ip, and Is. As a result, as in the second embodiment, it is possible to perform highly-accurate calibration of an oscillation frequency taking into account a nonlinear characteristic of a transistor included in the ring oscillator. Coefficients Ic, Ip, Is, $\alpha$, $\beta$, and $\gamma$ can be positive or negative.

Figure 14:
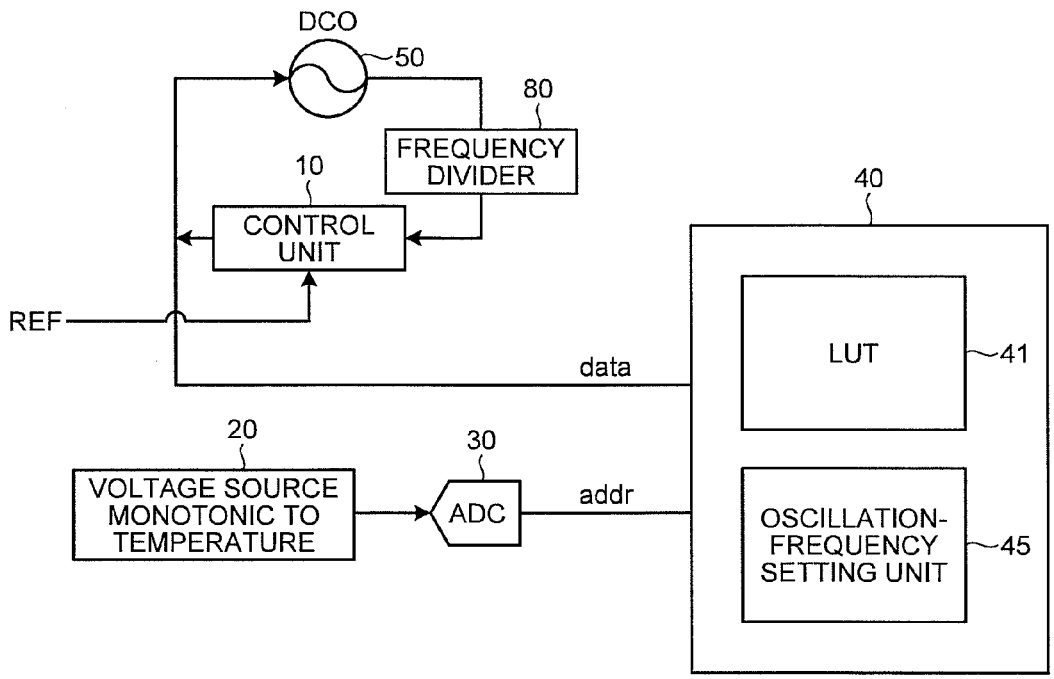
FIG. 14 is a diagram of a frequency divider connected between an output end of the DCO and an input end of a control unit.
Figure 15:
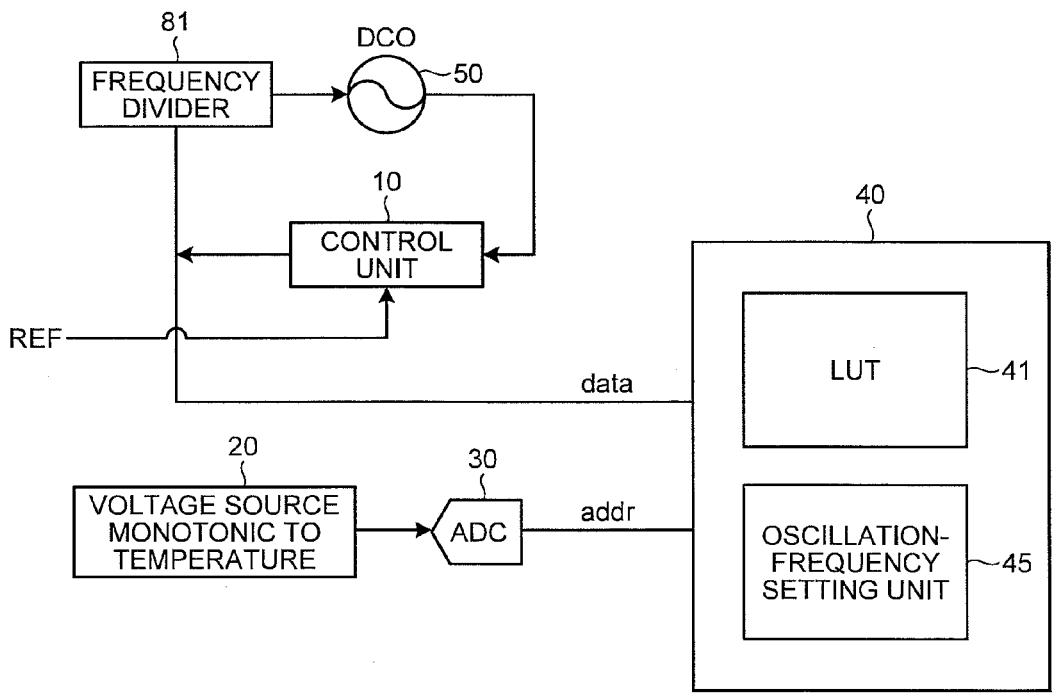
FIG. 15 is a diagram of a frequency divider connected to an input end of the DCO.
Figure 16:
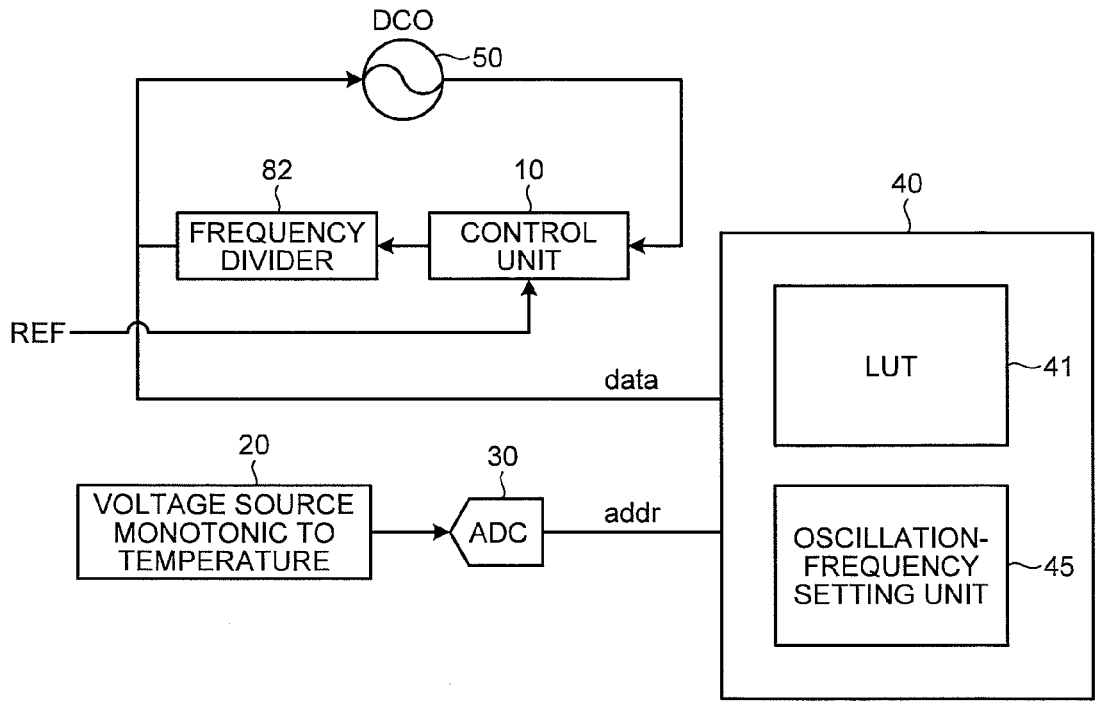
FIG. 16 is a diagram of a frequency divider connected to an output end of the control unit.

A semiconductor integrated circuit device according to a fourth embodiment of the present invention has a configuration substantially the same as that in the first embodiment. However, the semiconductor integrated circuit device according to the fourth embodiment is different in that the semiconductor integrated circuit device includes a frequency divider 80, 81, or 82. FIG. 14 is a diagram of a frequency divider connected between an output terminal of the DCO and an input terminal of the control unit. FIG. 15 is a diagram of a frequency divider connected to an input terminal of the DCO. FIG. 16 is a diagram of a frequency divider connected to an output terminal of the control unit. In the following explanation, components same as those in the first embodiment are denoted by the same reference numerals and signs and explanation of the components is omitted. Only differences from the first embodiment are explained below.

The frequency divider 80 shown in FIG. 14 is connected between an output terminal of the DCO 50 and an input terminal of the control unit 10 (or a control unit 18). The frequency divider 80 divides an oscillation frequency of the DCO 50 and outputs the divided oscillation frequency to the control unit 10. By adopting this configuration, it is possible to narrow a frequency operation range of a digital converter (equivalent to, for example the TDC) or the like included in the control unit 10. The frequency divider 81 shown in FIG. 15 is connected to an input terminal of the DCO 50 and divides a signal input to the DCO 50. The frequency divider 82 shown in FIG. 16 is connected to an output end of the control unit 10, divides a signal from the control unit 10, and outputs information for determining a divided oscillation frequency to the DCO 50 and the oscillation-frequency calibrating unit 40. Configurations shown in FIGS. 15 and 16 have a function equivalent to that of the configuration shown in FIG. 14 and can obtain an effect equivalent to that of the configuration shown in FIG. 14. The frequency divider 80, 81, or 82 can be set in the inside of the control unit 10.

In the first to fourth embodiments, the voltage references V1 and V2 and the oscillation frequencies F1 and F2 with respect to the two temperatures T1 and T2 are measured. In a fifth embodiment of the present invention, voltage reference and an oscillation frequency between these two points are calculated by linear approximation.

Figure 17:
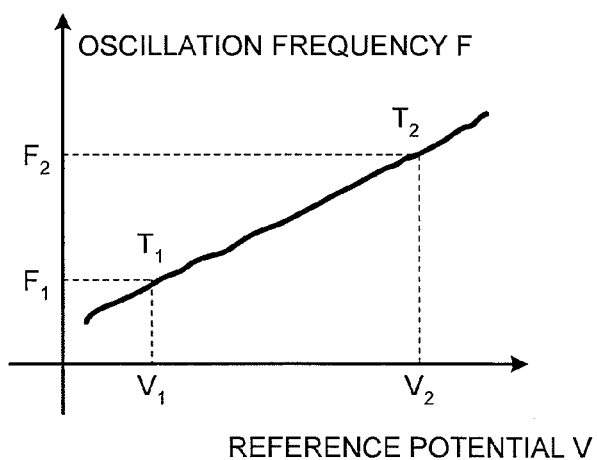
FIG. 17 is a graph of data linearly interpolated by an oscillation-frequency calibrating unit.

FIG. 17 is a diagram of data linearly interpolated by the oscillation-frequency calibrating unit. The oscillation-frequency setting unit 45 linearly interpolates the measured oscillation frequencies F1 and F2 and the measured voltage references V1 and V2. The oscillation-frequency setting unit 45 calculates a temperature coefficient with respect to the current source 43 based on an oscillation frequency and voltage reference after the linear interpolation. As a result, it is possible to accurately perform calibration of the DCO 50.

In a sixth embodiment of the present invention, the voltage reference T and the oscillation frequency F with respect to three or more temperatures are measured and a high-order temperature coefficient such as a quadratic function is calculated.

Figure 18:
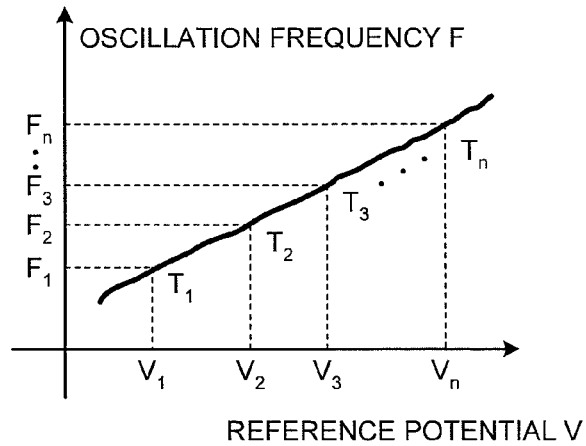
FIG. 18 is a graph for explaining interpolation processing by a plurality of measurement points.

FIG. 18 is a graph for explaining interpolation by a plurality of measurement points. The oscillation-frequency setting unit 45 performs interpolation processing for a plurality of oscillation frequencies F1 to Fn and a plurality of voltage references V1 to Vn measured at a plurality of temperatures T1 to Tn. Because a high-order temperature coefficient can be obtained by interpolating the oscillation frequencies and the voltage references using the temperatures T1 to Tn, it is possible to calibrate the DCO 50 at higher accuracy compared with the fifth embodiment.

Figure 19A:
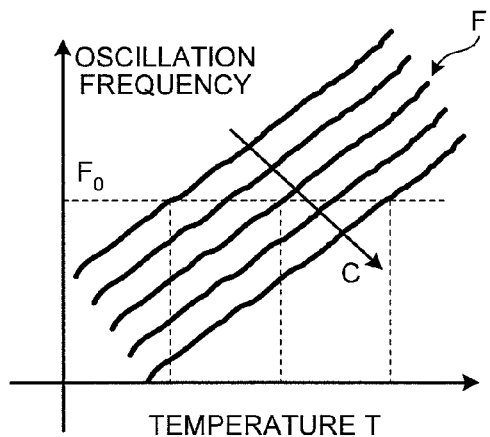
FIGS. 19A-19C are graphs of a relation between capacitance and voltage reference.
Figure 19B:
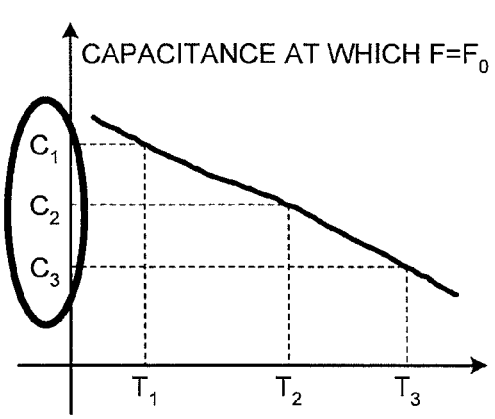
Figure 19C:
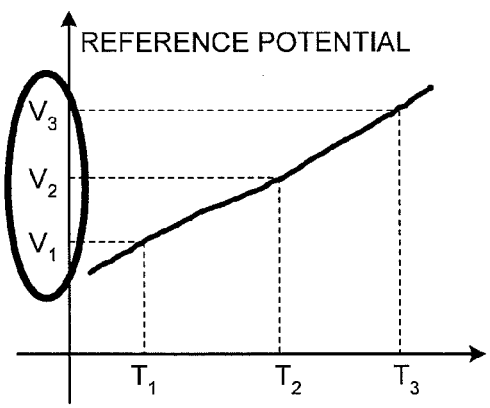

FIGS. 19A-19C are diagrams of a relation between capacitance and voltage reference in a seventh embodiment of the present invention. In FIG. 19A, a fixed oscillation frequency F0 and a temperature characteristic of an oscillation frequency of the DCO 50 set to a predetermined capacitance C are shown with respect to temperature. In FIG. 19A, as an example, temperature characteristics with respect to five kinds of capacitances are shown. In FIG. 19B, a plurality of capacitances at which the frequency F is the fixed oscillation frequency F0 with respect to temperature are shown. For example, capacitances at which the oscillation frequency F is F0 at the temperatures T1 to T3 are C1 to C3. In FIG. 19C, the voltage reference V corresponding to temperature is shown. In FIGS. 19B and 19C, because the temperature is common, the voltage reference V and the capacitance C are in a one-to-one relation with respect to a change in the temperature.

Figures 20, 21:
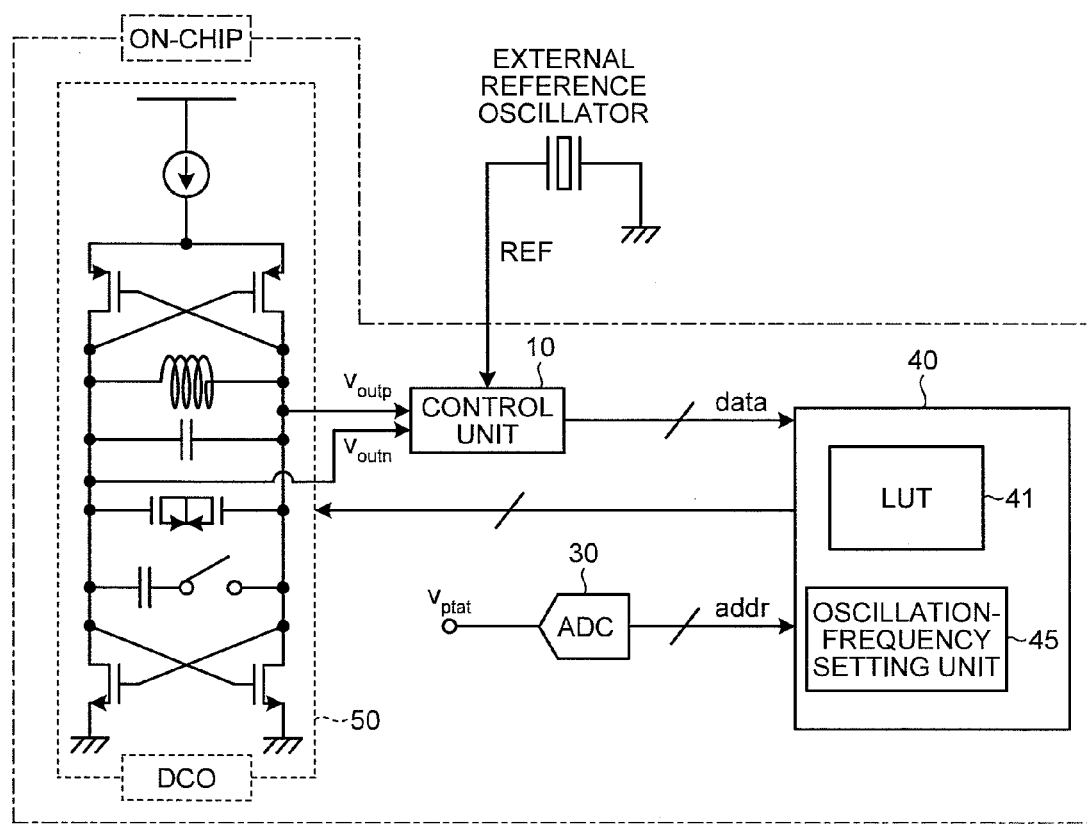
FIG. 20 is a diagram of a look-up table (LUT) according to a seventh embodiment of the present invention.
FIG. 21 is a diagram for explaining calibration operation performed when the seventh embodiment is applied to an LC oscillator.

FIG. 20 is a diagram of a LUT according to the seventh embodiment. In the LUT 41, the capacitance C (data), which is measured instead of the oscillation frequency F, indicating a control amount at which the oscillation frequency F is F0 is stored.

FIG. 21 is a diagram for explaining calibration operation performed when the seventh embodiment is applied to an LC oscillator. As in the first embodiment, information (data) and potential information (addr) for determining oscillation frequencies at the first and second temperatures are input to the oscillation-frequency calibrating unit 40.

In the LUT 41, the capacitance C and the potential V at which the oscillation frequency F is the fixed oscillation frequency F0 with respect to temperature are stored in association with each other based on the information (data) and the potential information (addr) corresponding to the first and second temperatures.

Figure 22:
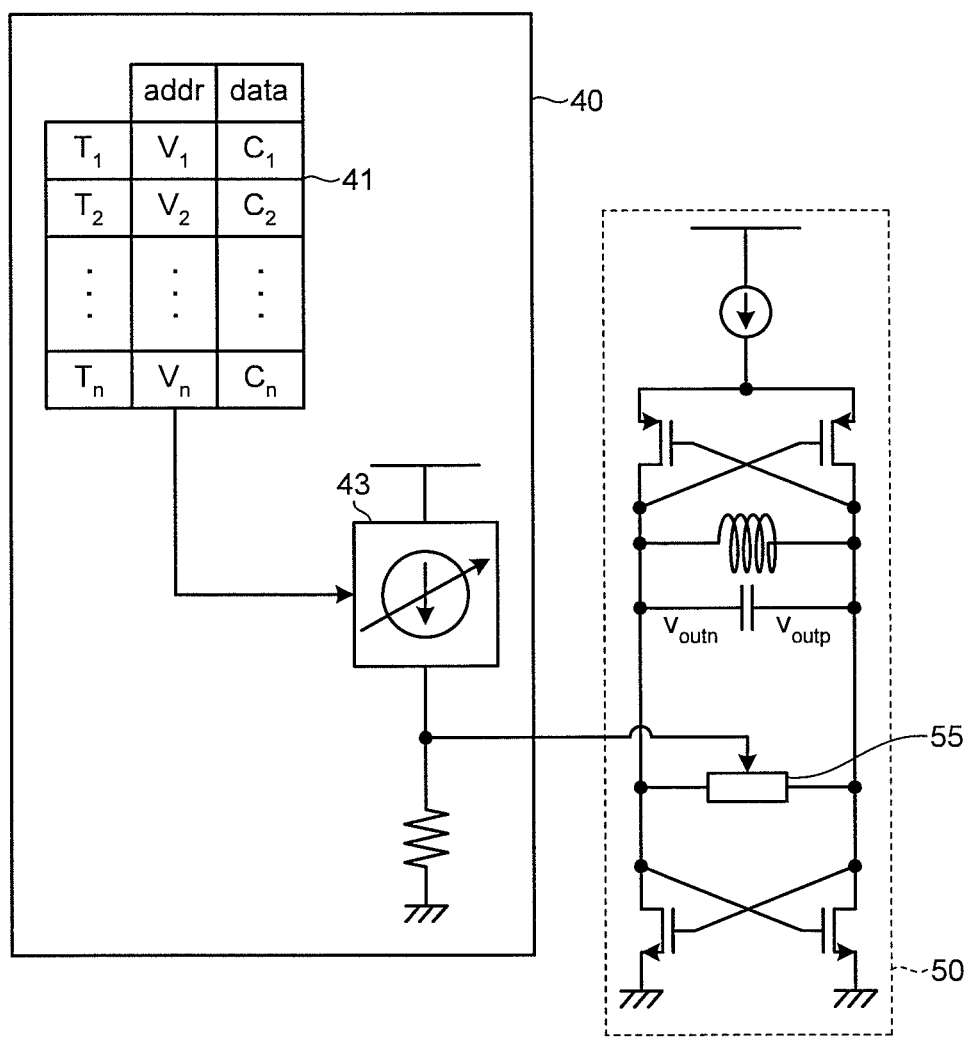
FIG. 22 is a diagram for explaining a control signal after the shipment of a DCO.

FIG. 22 is a diagram for explaining a control signal after the shipment of the DCO. In FIG. 22, the capacitance C is recorded in the LUC 41. The current source 43 generates a control signal for setting a temperature coefficient from the capacitance C and outputs the control signal to a capacitor unit 55. A control signal as a control amount corresponding to an absolute value of the capacitance C is output to the capacitor unit 55. The capacitor unit 55 is equivalent to the variable capacitor 51 or the switch 52 explained with reference to FIG. 7. It is assumed that at least one capacitor unit 55 is set in the LC oscillator. The oscillation-frequency calibrating unit 40 shown in FIG. 22 functions as an oscillation-frequency compensating unit that compensates for an oscillation frequency of the DCO 50. By adopting this configuration, it is possible to perform temperature compensation for the oscillation frequency with respect to fluctuation in the temperature T in the DCO 5.

In the seventh embodiment, the LUT 41 in which the capacitance C is stored is used for the LC oscillator. However, the LUT 41 can also be applied to a ring oscillator. In this case, the capacitance C of the LUT 41 is input to the current source 43. The current source 43 generates a control signal for setting a temperature coefficient and an absolute temperature and outputs the control signal to the transistors 53 and 54 of the DCO 50. As shown in FIG. 12, the current source 43 can be directly connected to the ring oscillator without the intervention of the transistors 53 and 54.

A current value can be used for the information (data) for controlling the DCO 50 instead of the capacitance C. Specifically, in the LUT 41, an electric current I and potential V at which the oscillation frequency F is the fixed oscillation frequency F0 with respect to temperature are stored in association with each other based on the information (data) and the potential information (addr) corresponding to the first and second temperatures. The current value indicates a magnitude of an electric current from the current source 43. An oscillation frequency of the ring oscillator is changed according to the current value. The electric current from the current source 43 and the oscillation frequency of the ring oscillator are in a substantially proportional relation. The oscillation-frequency setting unit 45 sets a temperature coefficient and an absolute value of the oscillation frequency referring to the LUT 41. The set temperature coefficient and absolute value of the oscillation frequency are stored in a storing unit. The current source 43 generates a control signal corresponding to the temperature coefficient stored in the storing unit and outputs the control signal to the capacitor unit 55 of the DCO 50. The absolute value stored in the storing unit is output to the capacitor unit 55 as a control signal corresponding to the absolute value. In this way, even when the current value is used instead of the capacitance C, it is possible to generate the control signal for setting the temperature coefficient of the oscillation frequency.

The oscillation-frequency calibrating unit 40 shown in FIG. 21 can perform the interpolation processing explained with reference to FIG. 18. In this case, it is assumed that the oscillation-frequency calibrating unit 40 shown in FIG. 21 includes an interpolation processing function of the oscillation-frequency setting unit 45.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
an inductance-capacitance (LC) oscillator including an induction element, a capacitor, and a variable capacitor which are connected in parallel; and
an oscillation-frequency calibrator configured to transmit a control signal for controlling the LC oscillator, based on information for determining an oscillation frequency of the LC oscillator and potential information from a voltage source configured to fluctuate with a monotonic characteristic with respect to temperature, wherein
the oscillation-frequency calibrator includes:
a storing unit that stores a temperature coefficient that is set based on the information for determining the oscillation frequency and the potential information; and
a current source which, in response to the temperature coefficient stored in the storing unit, outputs a first control signal to the variable capacitor by adding up:
a first current source having a zero-th order temperature coefficient;
a second current source having a first-order temperature coefficient; and
a third current source having a second-order temperature coefficient.

2. The semiconductor integrated circuit device of claim 1, wherein the storing unit stores the information for determining the oscillation frequency and an absolute value set based on the information for determining the oscillation frequency and the potential information;
the LC oscillator is configured to operate in response to the first control signal and a second control signal corresponding to the absolute value stored in the storing unit.

3. The semiconductor integrated circuit device of claim 1, wherein the oscillation-frequency calibrator is configured to calculate a temperature coefficient and an absolute value of a desired oscillation frequency based on the information for determining the oscillation frequency and the potential information, and to generate the control signal, and
wherein the oscillation-frequency calibrator is configured to generate the control signal based on:
a temperature coefficient representing a linear interpolant between a temperature coefficient of the oscillation frequency corresponding to a first potential from the voltage source and a temperature coefficient of the oscillation frequency corresponding to a second potential from the voltage source; and
an absolute value representing a linear interpolant between an absolute value of the oscillation frequency corresponding to the first potential from the voltage source and an absolute value of the oscillation frequency corresponding to the second potential from the voltage source.

4. The semiconductor integrated circuit device of claim 1,
wherein the oscillation-frequency calibrator is configured to calculate a temperature coefficient and an absolute value of a desired oscillation frequency based on the information for determining the oscillation frequency and the potential information, and to generate the control signal, and
wherein the oscillation-frequency calibrator is configured to linearly interpolate an Nth order temperature coefficient where N is an integer equal to or larger than 2 and an absolute value to generate the control signal.

5. The semiconductor integrated circuit device of claim 1,
wherein the oscillation-frequency calibrator is configured to calculate a temperature coefficient and an absolute value of a desired oscillation frequency based on the information for determining the oscillation frequency and the potential information, and to generate the control signal, and
wherein the oscillation-frequency calibrator comprises:
a controller configured to control an oscillation frequency from the oscillator corresponding with a reference oscillation frequency;
a table comprising a potential from the voltage source configured to fluctuate with the monotonic characteristic associated with temperature and the oscillation frequency from the oscillator; and
an oscillation-frequency setting module configured to set a temperature frequency of an oscillation frequency corresponding to the potential from the voltage source and an absolute value of the oscillation frequency corresponding to the potential from the voltage source, by referring to the table,
the semiconductor integrated circuit device further comprising a frequency divider connected between an output terminal of the controller and an input terminal of the oscillator.

6. The semiconductor integrated circuit device of claim 1,
wherein the oscillation-frequency calibrator is configured to calculate capacitance or an electric current with the oscillation frequency substantially constant with respect to temperature based on the information for determining the oscillation frequency and the potential information, and to generate the first control signal based on the capacitance or the electric current.

7. The semiconductor integrated circuit device of claim 6, further comprising:
an oscillation-frequency compensating module calibrator comprising a table comprising potential from a voltage source associated with capacitance or an electric current, the potential being configured to fluctuate with a monotonic characteristic with respect to temperature, and the oscillation frequency being substantially constant with respect to temperature and configured to fluctuate according to the potential at the capacitance or the electric current, wherein
the oscillation-frequency compensating module calibrator is configured to set capacitance or an electric current corresponding to the potential from the voltage source referring to the table.

* * * * *